United States Patent
Ilkbahar

(12) 
(10) Patent No.: US 6,289,447 B1
(45) Date of Patent: Sep. 11, 2001

(54) TOPOLOGY DEPENDENT COMPENSATION TO IMPROVE PERFORMANCE OF SELF-COMPENSATED COMPONENTS INCLUDING PROCESSORS BASED ON PHYSICAL RELATIONSHIP WITH OTHER SYSTEM COMPONENTS

(75) Inventor: Alper Ilkbahar, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/179,492

(22) Filed: Oct. 26, 1998

Related U.S. Application Data

(63) Continuation-in-part of application No. 08/824,066, filed on Mar. 24, 1997, now Pat. No. 5,898,321, and a continuation-in-part of application No. 08/823,220, filed on Mar. 24, 1997, now Pat. No. 5,869,983.

(51) Int. Cl.[7] .................................................. G06F 9/445
(52) U.S. Cl. .................................... 713/1; 326/83; 326/87
(58) Field of Search ................................ 713/1; 326/27, 326/83, 87; 324/763

(56) References Cited

U.S. PATENT DOCUMENTS

| | | | |
|---|---|---|---|
| 4,356,550 | * 10/1982 | Katzman et al. | 364/200 |
| 5,563,928 | * 10/1996 | Rostoker et al. | 377/20 |
| 5,666,067 | * 9/1997 | Sher et al. | 326/34 |
| 5,703,497 | * 12/1997 | Min | 326/33 |
| 5,742,184 | * 4/1998 | Martinez, Jr. | 326/83 |
| 5,798,971 | * 8/1998 | Larsen et al. | 365/189.05 |
| 5,869,983 | 2/1999 | Ilkbahar et al. | . |
| 5,877,634 | * 3/1999 | Hunley | 326/83 |
| 6,028,451 | 2/2000 | Ruff | . |
| 6,031,385 | * 2/2000 | Ilkbahar | 324/763 |
| 6,040,737 | * 3/2000 | Ranjan et al. | 327/543 |
| 6,204,684 | 3/2001 | Ruff | . |

\* cited by examiner

*Primary Examiner*—Thomas Lee
*Assistant Examiner*—Katharina Schuster
(74) *Attorney, Agent, or Firm*—Blakely, Sokoloff, Taylor & Zafman LLP

(57) ABSTRACT

A method and apparatus for compensating system components based on system topology. The present invention provides a method and apparatus for performance optimization through topology dependent compensation. In one embodiment, one or more components of a computer system are coupled to a bus via self-compensated buffer(s). The self-compensated buffer(s) allow operating characteristics to be set via external signals such as voltage levels. System components have compensation units that receive external signals and configure the operating characteristics of the self-compensated buffer(s). In this manner a system designer may set operating characteristics for various system components based on the topology of the specific system rather than designing for a worst-case scenario.

19 Claims, 4 Drawing Sheets

US 6,289,447 B1

TOPOLOGY DEPENDENT COMPENSATION TO IMPROVE PERFORMANCE OF SELF-COMPENSATED COMPONENTS INCLUDING PROCESSORS BASED ON PHYSICAL RELATIONSHIP WITH OTHER SYSTEM COMPONENTS

This U.S. patent application is a continuation-in-part of U.S. patent application Ser. No. 08/824,066 filed Mar. 24, 1997, now U.S. Pat. No. 5,898,321 and of U.S. patent application Ser. No. 08/823,220 filed Mar. 24, 1997, now U.S. Pat. No. 5,869,983.

FIELD OF THE INVENTION

The present invention relates to computer systems. More particularly, the present invention relates to optimizing computer system performance through component configuration based on topology.

BACKGROUND OF THE INVENTION

Prior art computer systems are typically designed based on worst-case scenarios. For example, if a processor is contemplated for single, dual, and multi-processor systems, the processor as well as other components are designed for the configuration having the slowest operating environment, which is typically determined by system bus frequency and topology. The slowest operating environment often corresponds to a multi-processor (e.g., more than two processors) configuration because of physical constraints such as bus length, bus load, etc. that are associated with coupling multiple processors and support circuits to a single bus.

However, smaller systems (e.g., single- and dual-processor computer systems) are often be capable of operating at higher system bus frequencies than multi-processor configurations. Because the multi-processor systems define the worst-case operating scenario, the smaller systems do not operate optimally unless components are redesigned to operate in the smaller system, which increases the cost of the smaller system. Because smaller systems are more numerous than multi-processor systems, most computer systems are designed with sub-optimal operating characteristics.

Bus systems are particularly susceptible to performance degradation in larger computer systems because buses are physically longer in systems having more components. Longer system buses result in lower operating frequencies because of transmission line considerations associated with the length and load of the bus. Therefore, the number of components coupled to a particular bus limits the operating frequency of the system bus and often acts as a bottleneck to system performance by defining the worst cast scenario for system topology.

What is needed are system components that may be compensated based on the specific system topology in which the components operate in order to improve performance of the system.

SUMMARY OF THE INVENTION

A method and apparatus for compensating components based on system topology is described. In one embodiment, the system includes one or more components with self-compensated buffer(s) and compensation unit(s) coupled to the self-compensated buffer(s). The compensation unit receives one or more external voltages corresponding to desired operating characteristics for the component and generates output signals to the self-compensated buffer that cause the self-compensated buffer to operate with the desired operating characteristics.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION

A method and apparatus for compensating system components based on system topology is described. In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid obscuring the present invention.

Briefly, the present invention provides a method and apparatus for performance improvement and possibly optimization through topology dependent compensation. In one embodiment, one or more components of a computer system are coupled to a bus via self-compensated buffer(s). The self-compensated buffer(s) allow operating characteristics to be set via external signals such as voltage levels. System components have compensation units that receive external signals and configure the operating characteristics of the self-compensated buffer(s). In this manner a system designer may set operating characteristics for various system components based on the topology of the specific system rather than designing all components for a worst-case scenario.

Figure 1:
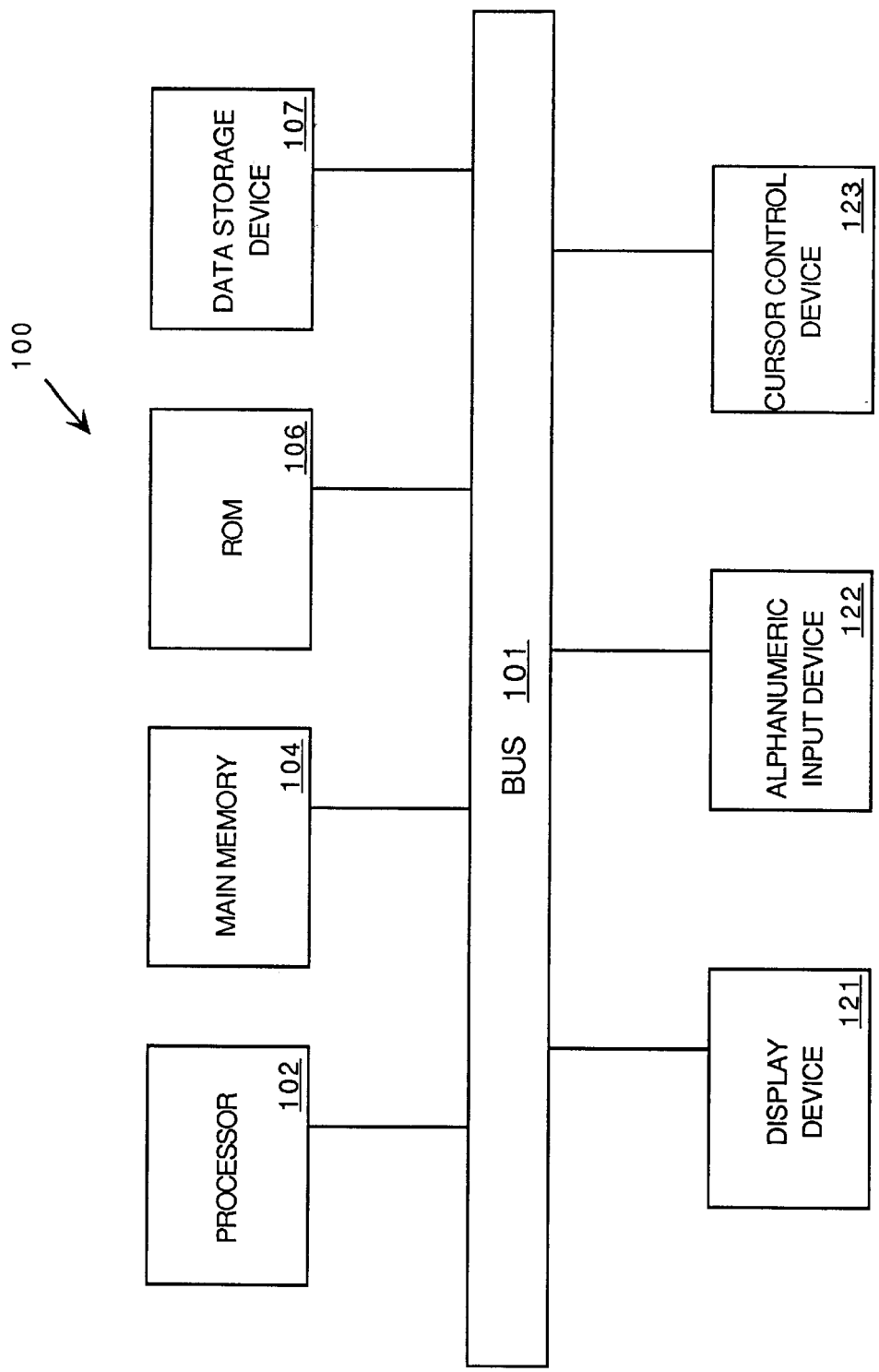
FIG. 1 is one embodiment of a single processor computer system.

FIG. 1 is one embodiment of a computer system. Computer system 100 comprises bus 101 or other device for communicating information, and processor 102 coupled with bus 101 for processing information. In one embodiment, bus 101 is an externally terminated bus; however, external termination of bus 101 is not required to practice the present invention. In one embodiment, processor 102 is an Intel Architecture (IA) processor available from Intel Corporation of Santa Clara, Calif.

Computer system 100 further comprises random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises read only memory (ROM) and/or other static storage device 106 coupled to bus 101 for storing static information and instructions for processor 102. Data storage device 107 is coupled to bus 101 for storing information and instructions.

Data storage device 107 such as magnetic disk or optical disc and corresponding drive can be coupled to computer system 100. Computer system 100 can also be coupled via bus 101 to display device 121, such as a cathode ray tube (CRT) or liquid crystal display (LCD), for displaying information to a computer user. Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

In one embodiment, processor 102 and one or more of the components coupled to bus 102, such as main memory 104, are source-synchronous components. Of course, any one or more components of computer system 100 may be source synchronous. Thus, computer system 100 may be either a partially source synchronous or fully source synchronous environment.

Figure 2:
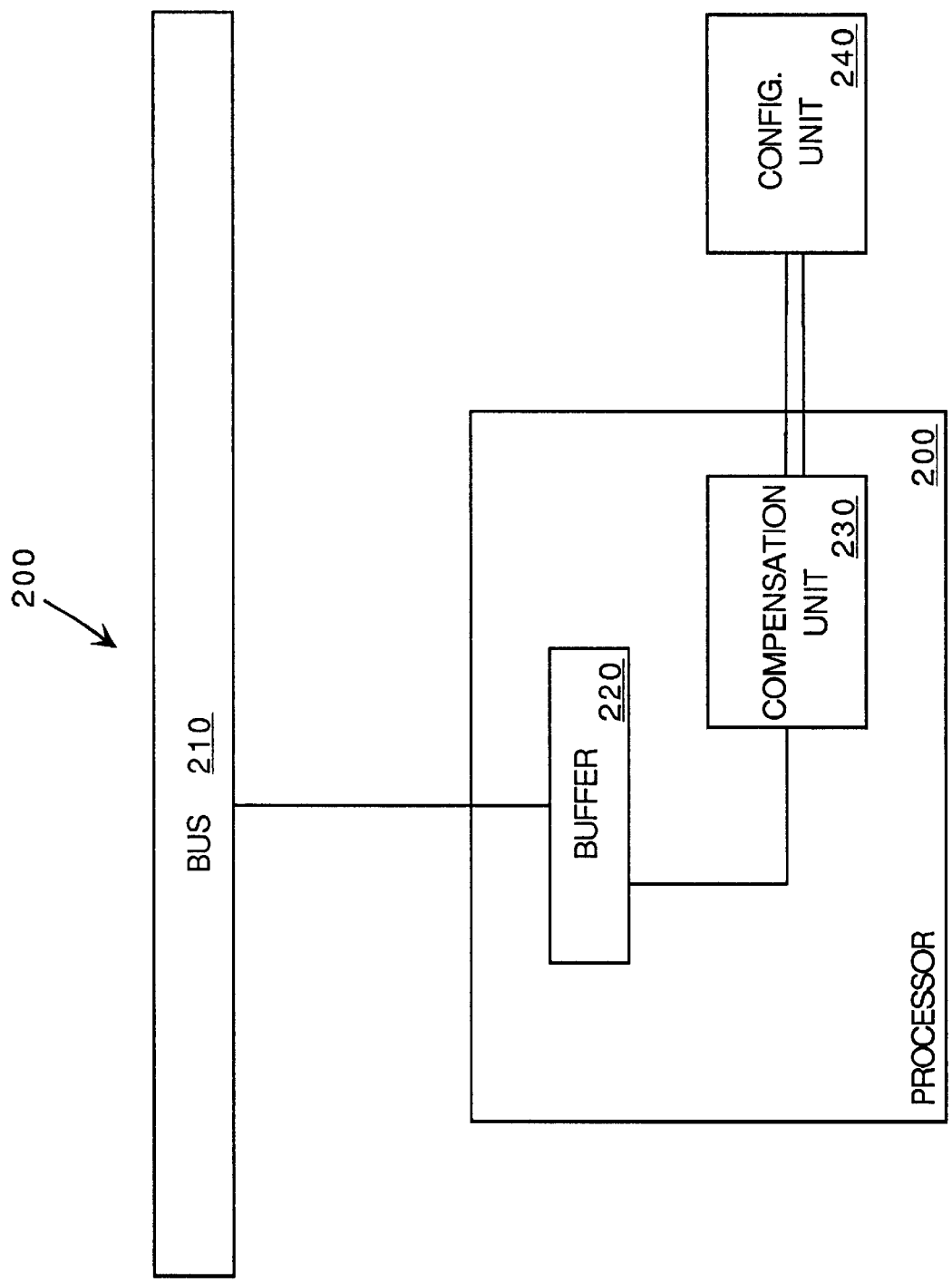
FIG. 2 is one embodiment of a processor compensated through topology dependent configuration.

FIG. 2 is one embodiment of a processor that can be configured through topology dependent configuration. While the example of FIG. 2 is described in terms of processors coupled to a bus, the description herein is not limited to processors and buses. For example, a memory device, I/O device, or other system component may be optimized as described herein.

Processor 200 includes buffer 220, which is a self-compensating buffer, in one embodiment. Compensation unit 230 is coupled to buffer 220 to provide control of buffer compensation. Compensation unit 230 is coupled to configuration unit 240 to receive external signals indicating desired operating characteristics for buffer 220. The external signals may be varied based on system configuration and topology.

In one embodiment, configuration unit 240 includes two precision resistors coupled between compensation unit 230 and a known reference voltage, such as a power supply output. The resistors provide a voltage that is used to configure processor 200. Thus, by varying the resistance provided by the resistors of compensation unit 230, a system designer can alter the operating characteristics of processor 200.

Because components in a system can be individually compensated with individual compensation units, the operating characteristics of multiple components within a system can be tailored for improved performance. For example, processors coupled near the center of the bus can have different operating characteristics that processors coupled near the end of the bus to allow processors to operate with characteristics based on the load and response of the system bus as applied to the individual processor.

Alternatively, configuration unit 240 can be adjustable resistors coupled between a known voltage and compensation unit 230. In another embodiment, configuration unit 240 may be a register that stores a configuration code that can be used to configure processor 200. Configuration unit may be any device that allows a known value to be provided to compensation unit 230 such that buffer 220 may be compensated based on the known values supplied by configuration unit 240.

In one embodiment, configuration unit 240 supplies two voltage levels to compensation unit 230. The voltage levels provided by compensation unit 230 are analog signals that represent the range of operating characteristics. The voltage levels correspond to a slew rate and an impedance for buffer 220. Of course, additional operating characteristics may also be supported, for example, operating frequency. In general, a faster slew rate corresponds to a higher operating frequency, which can be used in systems having smaller busses with fewer components. The trade-offs associated with slew rates and impedance are known in the art and are not discussed further herein.

In one embodiment, compensation unit 230 converts each voltage supplied by configuration unit 240 to a digital value to provide input to buffer 220. In one embodiment, traditional analog-to-digital conversion techniques are used. Compensation unit 230 is designed to accept a wide enough range of values such that the range of best-case to worst-case configuration scenario operating characteristic configurations are supported.

Buffer 220 operates with the operating characteristics (e.g., slew rate and impedance) determined by the signals provided by compensation unit 230. Buffer 220 then provides signals to bus 210 with the slew rate designated by configuration unit 240 and operates with the impedance designated by configuration unit 240.

Figure 3:
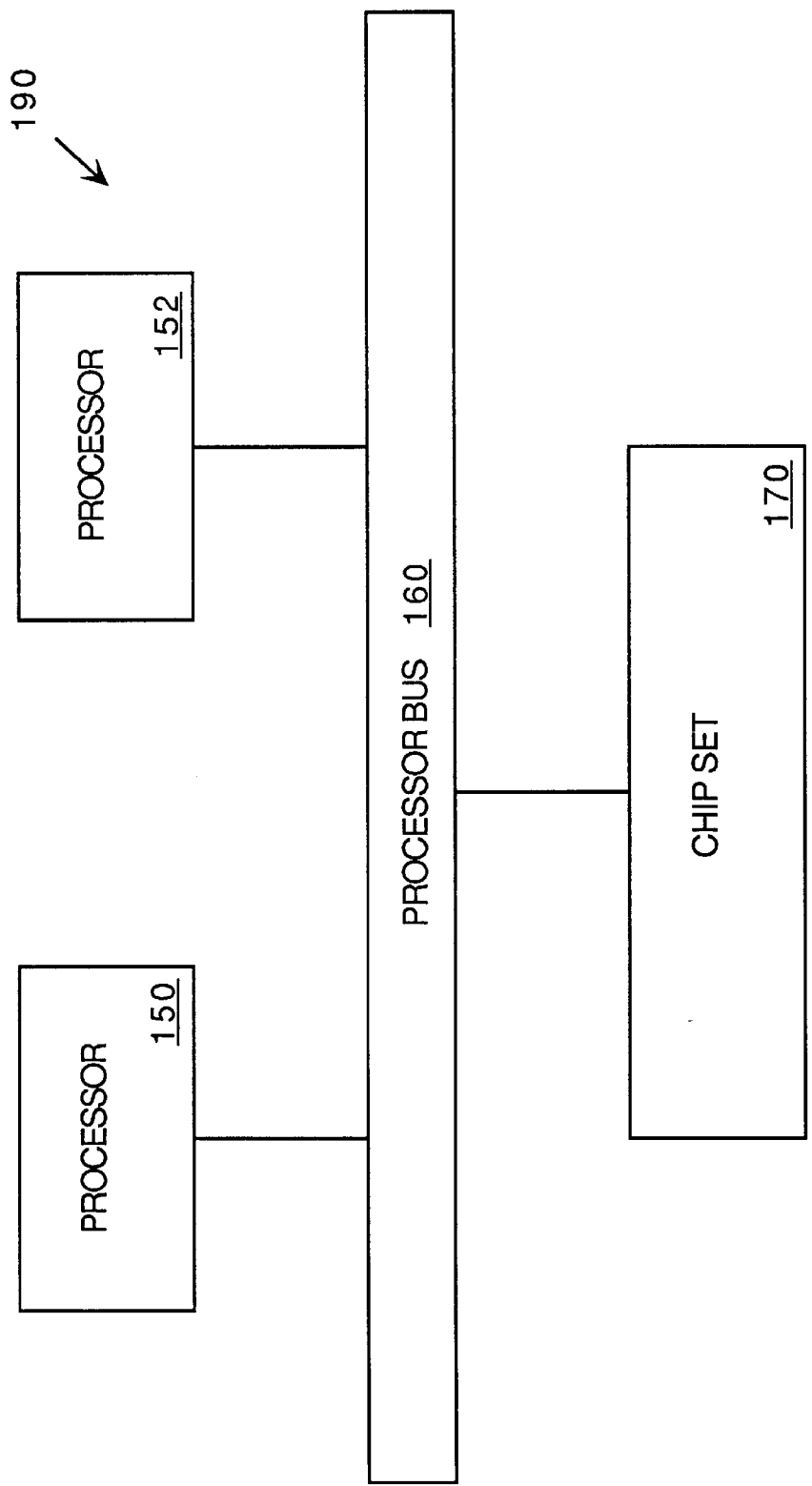
FIG. 3 is one embodiment of a multi-processor computer system.

FIG. 3 is one embodiment of a multiprocessor computer system. Computer system 190 generally includes multiple processors (e.g., processor 150 through processor 152) coupled to processor bus 160. Chip set 170 provides an interface between processor bus 160 and other components of computer system 190, such as a system bus (not shown in FIG. 3).

Computer system 190 is a higher performance system than computer system 100 of FIG. 1 in both bus architecture and number of processors. In one embodiment, processor bus 160 is an externally terminated bus that communicates information in a source synchronous manner. Processors 150 and 152 may be any type of processor. In one embodiment, processors 150 and 152 are Intel Architecture processors. Chip set 170 provides an interface between processor bus 160 and the remaining components of computer system 190 in any manner known in the art.

Figure 4:
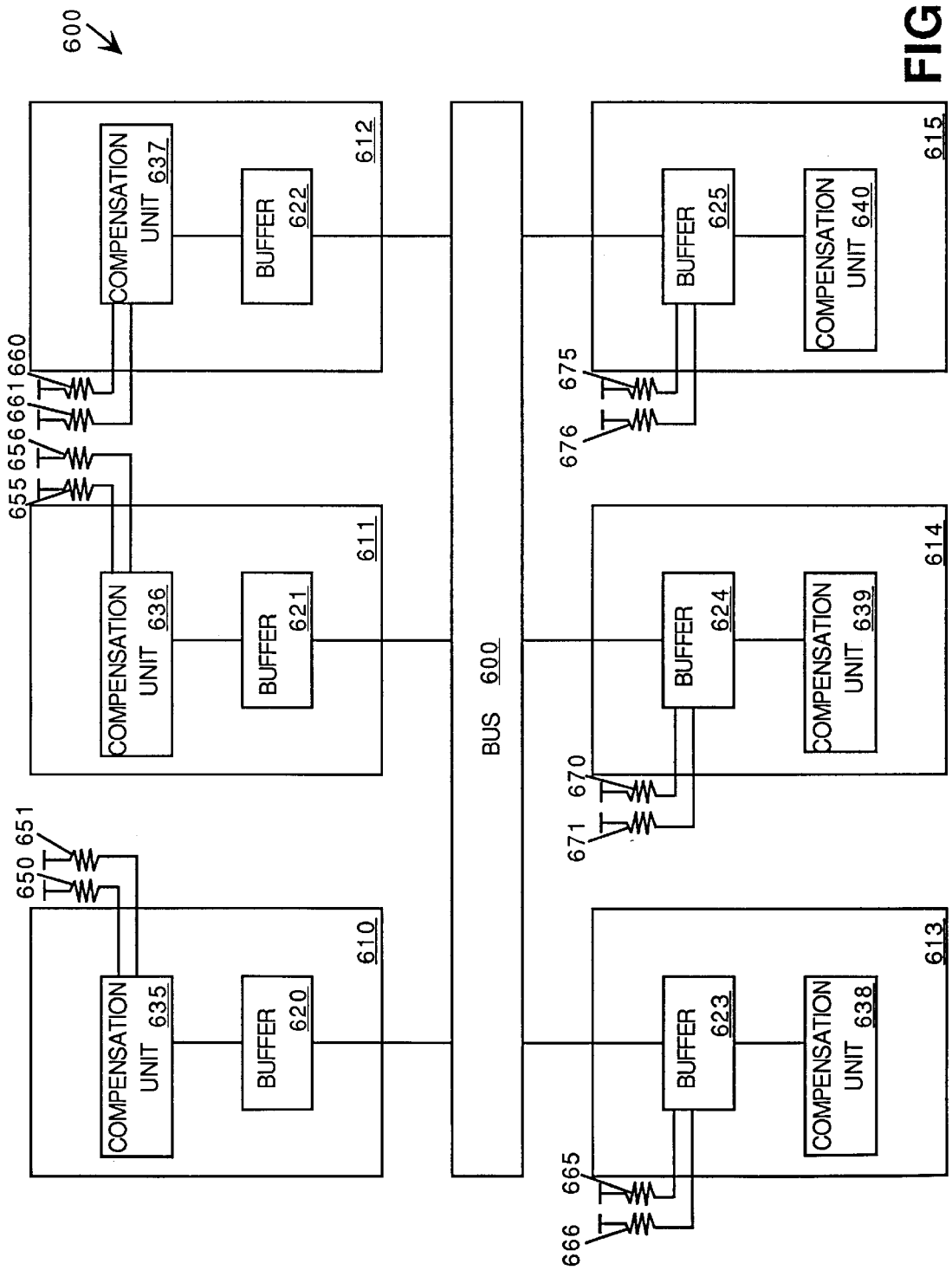
FIG. 4 one embodiment of a six-processor system having processors compensated through topology dependent configuration.

FIG. 4 is one embodiment of a six-processor system having processors compensated through topology dependent configuration. The compensation units of FIG. 4 receive compensation information from resistors coupled to power supply voltages; however, as discussed above, the present invention is not limited to such configurations.

In one embodiment, bus 600 is an externally terminated bus having pull-up resistors as termination devices; however, bus 600 may be terminated in any manner known in the art. Alternatively, bus 600 may be a non-terminated bus. In one embodiment, bus 600 is a processor bus coupled to one or more processors and a chip set (not shown in FIG. 4) that provides an interface to other components of computer system 600.

In one embodiment, the compensation units (e.g., 635, 636, 637, 638, 639 and 640) and buffers (e.g., 620, 621, 622, 623, 624 and 625) are designed to provide a range of operating characteristics covering at least the set of desired operating characteristics for which the processors (e.g., 610, 611, 612, 613, 614 and 615) are designed to operate. In one embodiment, the operating characteristics include, but are not limited to, slew rate and impedance.

By providing resistance values based on the physical location of the respective processors and the topology of computer system 600 with external resistors (e.g., 650, 651, 655, 656, 660, 661, 665, 666, 670, 671, 675, 676), system designers may tailor the operating characteristics of each processor in a system for optimal performance. Of course, other system components may be similarly optimized.

Assuming processors 611 and 614 are physically connected to bus 600 near the center of the bus and processors 610, 612, 613 and 615 are connected near the ends of bus 600, processors 611 and 614 can be configured to operate with a first set of operating characteristics while the remaining processors are configured to operate with a second set of operating characteristics. The first set of operating characteristics is different than the second set of operating characteristics because the load for processors 611 and 614 is different than the load for the remaining processors.

If, for example, the physical placement of processors 610, 611, 612, 613, 614 and 615 is asymmetric with respect to bus 600, the operating characteristics can be individually tailored based on the load for each processor.

In the foregoing specification, the present invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An integrated circuit comprising:
    a self-compensated buffer,
    a compensation unit coupled to the self-compensated buffer, the compensation unit configured to receive at least two external signals corresponding to desired operating characteristics, the compensation unit generating output signals to the self-compensated buffer that cause the self-compensated buffer to operate with the desired operating characteristics, wherein the operating characteristics are based, at least in part, on a physical relationship with another device;
    wherein the self-compensated buffer and the compensation unit are part of a processor in a multi-processor system.

2. The integrated circuit of claim 1, wherein the self-compensated buffer is an input/output (I/O) buffer.

3. The integrated circuit of claim 1 further comprising a second self-compensated buffer coupled to the compensation unit, wherein the second self-compensated buffer operates with the desired operating characteristics.

4. The integrated circuit of claim 1, wherein the operating characteristics include a slew rate and an impedance.

5. A multi-processor computer system comprising:
    a bus; and
    a plurality of processors coupled to the bus, each having a compensation unit coupled to receive at least two external signals, wherein the compensation unit generates output signals corresponding to operating characteristics for the respective processors, the respective processors further having at least one output buffer coupled to receive the output signals from the compensation unit and operating with the operating characteristics, wherein the operating characteristics are based, at least in part, on a physical relationship with another device.

6. The computer system of claim 5, wherein each of the respective processors is coupled to at least two resistors having resistance values that provide the slew rate and the impedance optimized for a physical location on the bus for each of the respective processor.

7. The computer system of claim 5, wherein the compensation unit in each respective processor compensates slew rate and impedance for the respective processor based on process, voltage, and temperature.

8. The computer system of claim 5, wherein the buffers are input/output (I/O) buffers.

9. The computer system of claim 5, wherein the operating characteristics include a slew rate and an impedance.

10. A method for performance optimization based on topology comprising:
    receiving one or more signals corresponding to a desired slew rate and an impedance for each processor in a multi-processor computer system, wherein the slew rate and the impedance are based, at least in part, on a physical relationship with another device; and
    compensating one or more buffers to operate with the desired slew rate and impedance in response to the one or more signals.

11. The method of claim 10, wherein the one or more signal corresponding to the desired slew rate and impedance are received through at least two resistors that indicate the plurality of operating characteristics.

12. The method of claim 10, wherein the and or more buffers are input/output (I/O) buffers in a processor.

13. A system comprising:
    a bus;
    a first processor having a first buffer coupled to the bus and a first compensation unit coupled to the first buffer, wherein the first compensation unit is coupled to receive at least two voltages from a first set of external resistors that provide a voltage to the first compensation unit indicating operating characteristics for the first buffer based on a first set of physical characteristics corresponding to the first processor; and
    a second processor having a second buffer coupled to the bus and a second compensation unit coupled to the second buffer, wherein the second compensation unit is coupled to receive at least two voltages from a second set of external resistors that provide a voltage to the second compensation unit indicating operating characteristics for the second buffer based on a second set of physical characteristics corresponding to the second processor.

14. The system of claim 13, wherein the first buffer comprises an input/output (I/O) buffer.

15. The system circuit of claim 13, wherein the operating characteristics include a slew rate and an impedance.

16. An integrated circuit comprising:
    a self-compensated buffer;
    a compensation unit coupled to the self-compensated buffer, the compensation unit configured to receive at least two external signals corresponding to desired operating characteristics, the compensation unit generating output signals to the self-compensated buffer that cause the self-compensated buffer to operate with the desired operating characteristics, wherein the operating characteristics are based, at least in part, on a physical relationship with another device;
    wherein the self-compensated buffer and the compensation unit are part of a processor in a single processor system.

17. The integrated circuit of claim 16, wherein the self-compensated buffer is an input/output (I/O) buffer.

18. The integrated circuit of claim 16 further comprising a second self-compensated buffer coupled to the compensation unit, wherein the second self-compensated buffer operates with the desired operating characteristics.

19. The integrated circuit of claim 16, wherein the operating characteristics include a slew rate and an impedance.

* * * * *